United States Patent [19]
Laube et al.

[11] Patent Number: 5,989,397
[45] Date of Patent: Nov. 23, 1999

[54] GRADIENT MULTILAYER FILM GENERATION PROCESS CONTROL

[75] Inventors: Samuel J. P. Laube, Monroe; Andrey A. Voevodin; Jeffrey S. Zabinski, both of Dayton; Steven R. LeClair, Spring Valley, all of Ohio

[73] Assignee: The United States of America as represented by the Secretary of the Air Force, Washington, D.C.

[21] Appl. No.: 08/961,528

[22] Filed: Oct. 30, 1997

Related U.S. Application Data

[60] Provisional application No. 60/030,515, Nov. 12, 1996.

[51] Int. Cl.[6] .................................................... C23C 14/34
[52] U.S. Cl. ............................. 204/298.03; 204/298.01; 204/298.02; 364/468.26; 427/553; 427/554; 118/620; 118/641
[58] Field of Search ....................... 364/468.26; 427/553, 427/554; 118/620, 641; 204/298.03, 298.01, 298.02

[56] References Cited

U.S. PATENT DOCUMENTS

| | | | |
|---|---|---|---|
| H1210 | 7/1993 | Jansen | 427/249 |
| 4,500,408 | 2/1985 | Boys et al. | 204/298 |
| 4,988,421 | 1/1991 | Drawl et al. | 204/192.3 |
| 5,126,028 | 6/1992 | Hurwitt et al. | 204/192.13 |
| 5,395,735 | 3/1995 | Nagata et al. | 430/270 |
| 5,535,128 | 7/1996 | Laube et al. | 364/468.26 |
| 5,612,887 | 3/1997 | Laube et al. | 362/468.26 |

*Primary Examiner*—Nam Nguyen
*Assistant Examiner*—Julian A. Mercado
*Attorney, Agent, or Firm*—Gina S. Tollefson; Gerald B. Hollins; Thomas L. Kundert

[57] ABSTRACT

Process control for generating graded multilayer films repetitively and consistently using both pulsed laser sputtering and magnetron sputtering deposition techniques. The invention includes an apparatus which allows for set up of an ultrahigh vacuum in a vacuum chamber automatically, and then execution of a computer algorithm or "recipe" to generate desired films. Software operates and controls the apparatus and executes commands which control digital and analog signals which control instruments.

19 Claims, 11 Drawing Sheets

Multilayer Recipe Flow Chart

Clean Substrate

Deposit interlayer

GRADIENT MULTILAYER FILM GENERATION PROCESS CONTROL

This application claims benefit of Provisional Appl. Ser. No. 60/030,515, filed Nov. 12, 1996.

RIGHTS OF THE GOVERNMENT

The invention described herein may be manufactured and used by or for the Government of the United States for all governmental purposes without the payment of any royalty.

BACKGROUND OF THE INVENTION

The present invention relates generally to systems and methods for high vacuum sputtering, and more particularly to process control for the combined deposition methods of magnetron sputtering and pulsed laser plasma sputtering.

In a conventional pulsed laser sputtering or deposition technique of film generation, a pulsed laser beam is focused onto a target of film material. Laser-target interactions result in material ablation and an energetic gas plume or plasma which condenses on a substrate as a film. In a conventional magnetron sputtering technique of film generation, the film is grown by bombardment of a target film material with ions of inert gas. The bombarding atoms are ionized and accelerated toward the target by intersecting magnetic and electric fields. A chemically reactive gas may be added to grow films of nitrides, carbides or oxides in conjunction with appropriate transition metal targets.

Prior work, U.S. patent application Ser. No. 08/641,042, included combining the deposition techniques of magnetron sputtering with pulsed laser plasma sputtering. A drawing of such a system is shown at 10 in FIG. 1. In brief, an ultra-high vacuum chamber 11 is operatively connected to a vacuum system 13 which is capable of evacuating chamber 11. A rotatable substrate table 15 is disposed within chamber 11. A gas inlet 18 defined in a wall of chamber 11 communicates with a source of inert gas 19 and a source of reactive gas 20 both of which can be selectively inserted into chamber 11. A magnetron sputtering source 21 is disposed in a wall of chamber 11 for performing sputtering onto a substrate disposed on table 15. A pulsed laser generator is shown at 24 external of chamber 11 along with a mirror 25, focusing lens 26 and an entrance window 27 in the wall of chamber 11 for directing a pulsed laser beam 31 onto rotatable target 28 within chamber 11. The laser beam ablates the target 28 for deposition as a thin film onto a substrate on table 15.

This system may be operated in three different modes, namely, sequential deposition wherein magnetron sputtering and pulsed laser deposition are performed in sequence in either order to produce a film deposit, simultaneous deposition wherein magnetron sputtering and pulsed laser deposition operations are performed simultaneously, and a mode comprising laser film processing during film growth. In the sequential deposition mode of operation, power is applied to magnetron source 21 to start sputtering and the sputtered material is deposited as a film onto the substrate disposed on table 15. A reactive gas 20 may be added to chamber 11 in order to synthesize a film comprised of a compound such as carbide, nitride and/or oxide. After a desired film thickness is achieved, magnetron source 21 is switched off and pulsed laser deposition is initiated by energizing laser generator 24 and focusing a laser beam 31 onto target 28. Ablated material from target 28 is deposited on the substrate disposed on table 15. Suitable control of motor 16 allows substrate table 15 to be positioned in confronting relationship to target 28 as shown by solid lines in the drawing or to magnetron sputtering source 21 as shown by dashed lines. The simultaneous deposition mode is analogous to the sequential deposition mode except the magnetron source 21 and pulsed laser generator 24 are operated simultaneously at chamber 11 pressures corresponding to that required for magnetron sputtering. During such depositions, table 15 may either be continuously rotated or fixed at selected incidence angles with respect to the target 28 and magnetron source 21. The laser film processing during film growth is analogous to the other modes except that all or part of laser beam 31 is delivered to the surface of the film as it is deposited in order to directly control film microstructure. Additionally, laser processing of the magnetron target may be employed to initiate plasma from high refractory materials and promote plasma ionization to a desired level.

The combined processes of pulsed laser deposition and magnetron sputtering, either used in sequence or simultaneously, are attractive for use in the tool making industry and other industries where thin, hard coatings are desired. The combined processes are able to produce graded thin films on tools or manufacturing parts which are harder, more resilient and last longer than films produced with conventional methods. In the case of sequential deposition, a layer of titanium may be deposited followed by a layer of diamond-like carbon, followed by thinner layers of titanium and diamond-like carbon followed by even thinner layers of titanium and diamond-like carbon and the film is graded in this manner. If the two processes are employed simultaneously, a layer of titanium is deposited and as the titanium layer deposition is near completion, diamond-like carbon is added to the mixture until the entire film composition is 100% diamond-like carbon and then titanium is gradually added for a three-layer film of Ti—DLC—TiX, where X is a reactive gas. The film is thus graded in a manner where the concentration of any one material is gradually changed and there is no distinct separation between layers as results in employing the sequential deposition mode. Simultaneous deposition is often preferred because nicks, cracks and other flaws in the substrate can be filled in by this method making a substrate to film interface of higher integrity.

As a practical matter, a method of process control and automation is necessary so that multilayer thin film generation using the combined techniques of magnetron sputtering and pulsed laser deposition can be accomplished repetitively and consistently. The present invention provides a control method and automated apparatus for generating graded multilayer films using the combined methods of pulsed laser sputtering and magnetron sputtering. The control method and automated apparatus eliminates operator error, provides a record of any deviations in substrate preparation and film deposition and completely integrates all automation components using one computer. A record of deviations in substrate preparation and film deposition allows one to determine whether the deviation of the film deposition is within acceptable specification limits, or whether the batch must be discarded. Integration of automation components using one computer allows the possibility of a deviation in one variable to be compensated by another variable to produce consistent film production.

SUMMARY OF THE INVENTION

The invention provides process control for generating graded multilayer films repetitively and consistently using both pulsed laser sputtering and magnetron sputtering deposition techniques. The invention includes an apparatus which allows for set up of an ultrahigh vacuum in the chamber automatically, and then execution of a computer algorithm or "recipe" to generate the desired film. Software which operates and controls the apparatus executes commands which control digital and analog signals which control instruments.

It is an object of the invention to provide process control for generating graded, multilayer thin films repetitively and consistently using the combined methods of pulsed laser sputtering and magnetron sputtering.

It is another object of the invention to provide an automated apparatus capable of generating graded, multilayer films using pulsed laser deposition and magnetron sputtering deposition techniques.

It is another object of the invention to provide process control for generating graded, multilayer films that are harder and more resilient than films generated using conventional techniques.

It is another object of the invention to generate Ti—TiN—DLC and Ti—CN—DLC films with multiple layers in a repetitive and consistent manner.

These and other objects of the invention are described in the description, claims and accompanying drawings and are achieved by a computer control system for generating graded magnetron sputtering and pulsed laser plasma deposition multilayer films on a substrate disposed within a vacuum chamber, comprising:

a digital computer having data input and output communication ports;

an ultrahigh vacuum chamber pressure control system comprising,
    a vacuum chamber pressure control algorithm received in said digital computer,
    vacuum chamber pressure measuring coarse and sensitive pressure to electrical signal transducers connected with said vacuum chamber and also with said digital computer input port and said pressure control algorithm,
    vacuum chamber coarse and sensitive pressure control valves connected between a source of vacuum and said vacuum chamber and responsive to computer output port pressure control algorithm output signals and algorithm input signals received from said pressure measuring coarse and sensitive transducers;

a plurality of computer controlled vacuum chamber inert gas mass flow regulating components capable of delivering inert gas into said chamber at a preselected mass flow rate including an inert gas supply coupled to said digital computer output port;

an inert gas chamber pressure control system comprising,
    an inert gas chamber pressure and composition control algorithm received in said digital computer,
    a magnetron spectral emission sensor communicating with said vacuum chamber and said pressure and composition control algorithm,
    a mass spectrometer communicating with said vacuum chamber and said pressure and composition control algorithm,
    a pressure gage communicating with said vacuum chamber and said pressure and composition control algorithm and a pressure controller communicating with said vacuum chamber and said pressure and composition control algorithm,
    chamber pressure control valves communicating with said pressure controller, a plurality of computer controlled magnetron current and voltage monitoring and regulating components communicating with said digital computer input port and a magnetron sputtering control algorithm received in said digital computer;

a plurality of computer controlled laser plasma energy monitoring components communicating with said digital computer input port and a laser plume control algorithm received in said digital computer;

a multilayer film deposition rate monitoring component communicating with said digital computer input port and a deposition rate algorithm received in said digital computer; and substrate bias and temperature regulating components communicating with said digital computer input port and a substrate bias and temperature control algorithm received in said digital computer, negative bias and substrate temperature regulation operating to cause film deposition at a faster rate.

DETAILED DESCRIPTION

Figure 1:
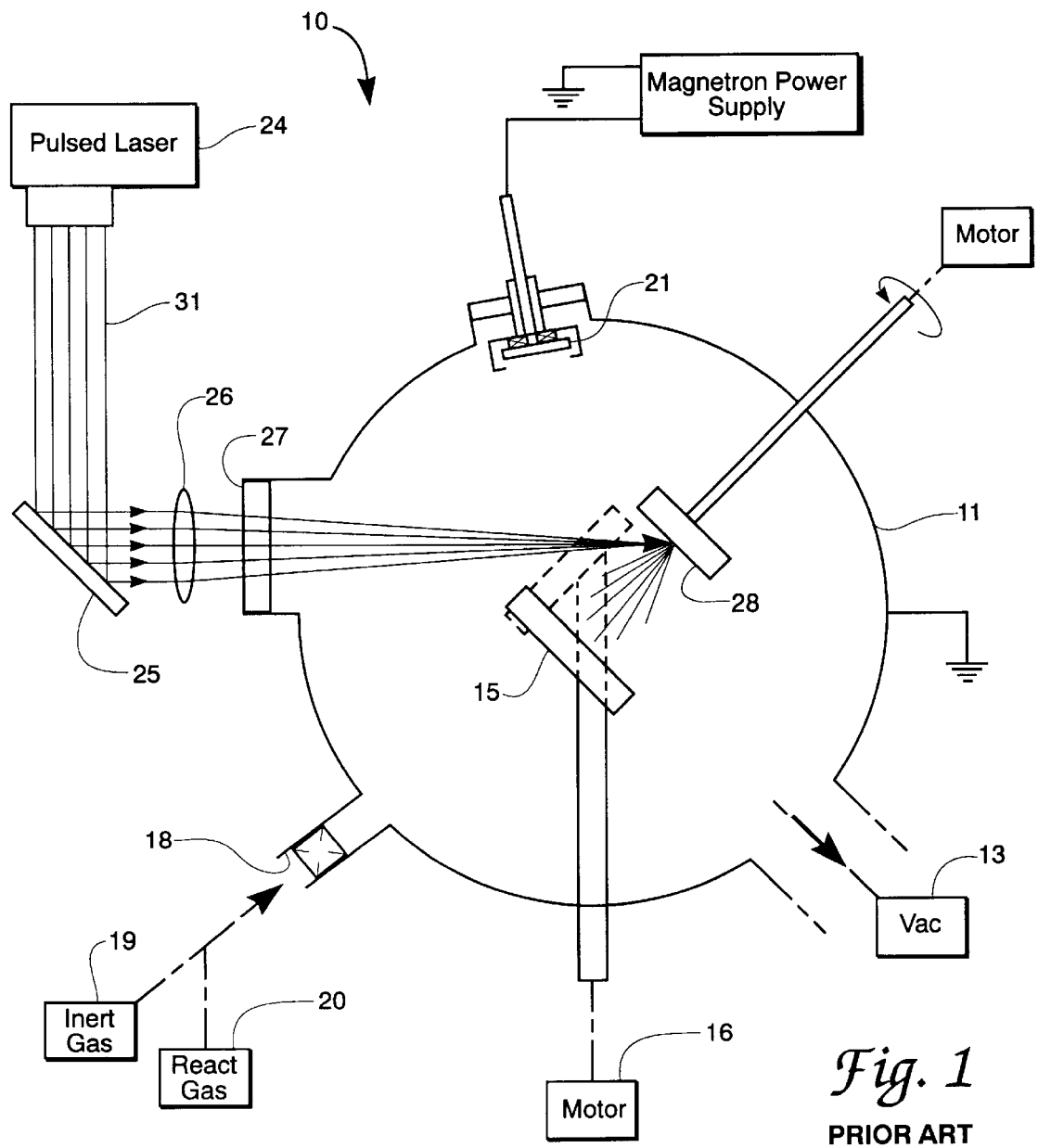
FIG. 1 is a diagram of a system combining pulsed laser sputtering and magnetron sputtering deposition techniques.
Figure 2:
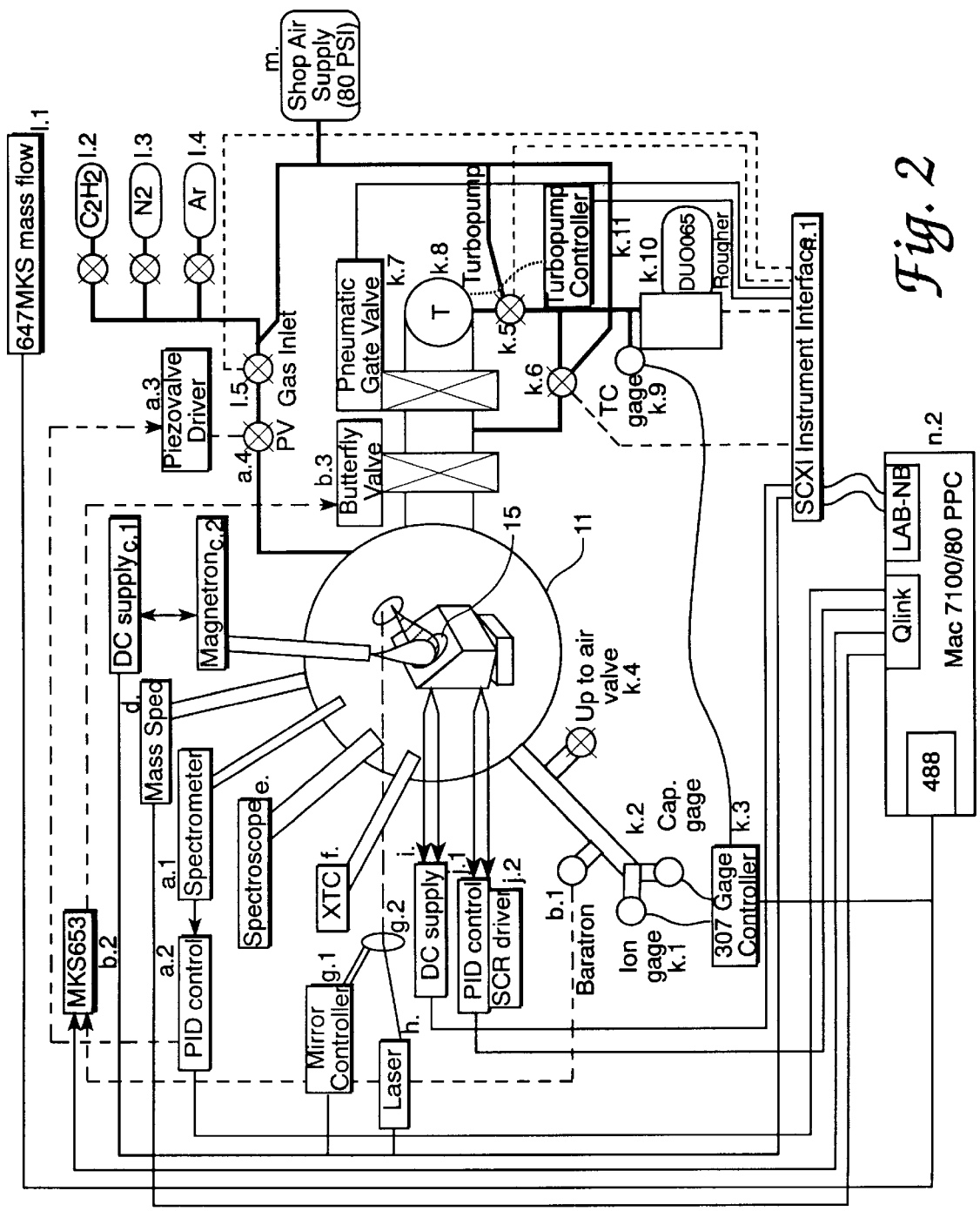
FIG. 2 is an diagram of an apparatus for automated generation of graded multilayer films using both pulsed laser sputtering and magnetron sputtering techniques.

The invention provides process control for generating graded multilayer films repetitively and consistently using both pulsed laser sputtering and magnetron sputtering deposition techniques. Referring now to FIG. 2, shown therein is an apparatus for automating generation of graded multilayer films using both pulsed laser sputtering and magnetron sputtering deposition techniques. In brief, the FIG. 2 apparatus utilizes computer automation to operate gas valves to control chamber pressure, mass flow rates to control inert gas composition, substrate temperature and biasing to control film microstructure and laser parameters to control the quality of the laser beam. Several monitoring sensors are used to provide in-situ data to a process control algorithm. The apparatus allows for set up of the ultrahigh vacuum in the chamber automatically, and then execution of a computer algorithm or "recipe" to generate the desired film. Software which operates and controls the apparatus executes commands which control digital and analog signals which control instruments. Substrate temperature, chamber total gas pressure, and magnetron sputtering plasma emission spectroscopy are process boundary condition parameters that are controlled by independent feedback loops. The independent boundary condition control loops for these parameters only require setpoint data to effect process changes. Components of this novel automation are detailed below.

Components a.1–a.4 in FIG. 2 operate to control the sputtering level or spectral emission level of the magnetron source by altering instantaneous chamber pressure of inert gas. Inert gases suitable for use in the practice of the invention include argon, krypton, xenon or selected mixtures thereof. The optical emission spectrometer shown at a.1 detects the spectral emission from the target material which in turn indicates the instantaneous pressure of the inert gas within the chamber. The lower the spectral emission from the target material the lower the pressure of the inert gas within the chamber, while the higher the spectral emission from the target material the higher the pressure of the inert gas within the chamber. Accordingly, an analog output signal from the optical emission spectrometer a.1 representing the spectral emission of the target material is communicated to a proportional integral derivative (PID) feedback controller shown at a.2 in FIG. 2. The PID feedback controller has a setpoint value of instantaneous inert gas pressure remotely commanded. That is, the feedback controller has preset values in the computer, shown at n.2, which indicate the rate of change which is acceptable for chamber gas pressure. The PID feedback controller a.2 then sends an analog output to the piezoelectric valve driver shown at a.3 in FIG. 2. The piezoelectric valve driver operates to actuate a high speed piezoelectric valve shown at a.4 in FIG. 2. The high speed piezoelectric valve, when so actuated, opens and closes rapidly and releases inert gas from the chamber 11 to thereby reduce instantaneous inert gas pressure within the chamber and in turn reduce spectral emission of the magnetron source.

Components b.1–b.3 in FIG. 2 alter instantaneous chamber pumping rate based on chamber pressure, thus regulating inert gas pressures at any mass flow. These components work in conjunction with the mass flow and gas delivery system described herein to monitor inert gas pressure and composition. All instrument set up parameters are remotely altered and recorded in the computer n.2. A Baratron pressure gage shown at b.1 senses gas pressure entering the vacuum chamber. A proportional integral (PI) feedback controller shown at b.2. receives an analog output from the pressure gage b.1. and has a setpoint that is remotely commanded by the computer n.2 and indicates whether the pressure is in an acceptable range by transmitting an analog output voltage signal. A butterfly valve shown at b.3. receives the analog actuation voltage from the feedback controller MKS653 of b.2 and controls angular position of the butterfly.

Components c.1 and c.2 operate to alter instantaneous direct current and voltage, based on sensed magnetron power, thus regulating the quantity of target material atoms ionized and in turn magnetron deposition rate. A direct current power supply for magnetron current and voltage regulation is represented at c.1. The direct current power setpoint on/off control is remotely commanded from computer n.2. Shown at c.2 is a water-cooled magnetron titanium sputtering source capable of depositing titanium thin films on a substrate. DC power for the sputtering source of c.2 is supplied from the direct current power supply of c.1. All instrument set up parameters and data are remotely altered and recorded in computer n.2.

A quadrapole mass spectrometer is shown at d. and is used to monitor chamber inert gas constituents to ensure the desired gas composition is maintained. The spectrometer setup parameters and data are remotely altered and recorded in computer n.2.

An optical emission spectroscope for pulsed laser deposition plume species energy measurement is shown at e. Laser deposition plume species energy is measured to give an indication of the quality of the film being deposited by measuring the energy of the fluoresced plasma as a function of time. If there are a small number of atoms fluorescing, the quality of the film will be degraded. For example, in a coating of diamond-like carbon wherein the plume species is not holding enough energy as a function of time, the layer will likely not be of the desired hardness. In the preferred arrangement of the invention an emission spectroscope with the capability for high speed, 400 megasample per second acquisition rate, is employed at e. Emission spectroscope setup parameters and data are remotely altered and recorded in computer n.2.

A quartz crystal microbalance sensor with 0.01 nm resolution for co-located thickness and deposition rate determination is represented as component f. and is situated in close proximity to the substrate table 15 in the vacuum chamber 11. The quartz crystal microbalance sensor, XTC, at f. receives the same deposition as the substrate and vibrates according to the amount of deposition. Accordingly, measuring the change in frequency of the quartz crystal microbalance sensor indicates the deposition rate on the quartz crystal microbalance sensor and, in turn, the deposition rate on the substrate on table 15. Microbalance material density, thickness, and other setup parameters and data are remotely altered and recorded in computer n.2.

An electronic mechanical mirror steering apparatus to control laser beam position on target for pulsed laser deposition is shown as component g.1. The mirror g.2. is rastered during the pulsed laser deposition phase of the process in order to obtain laser contact on the entire target material. Rastering the laser beam is preferred to rotating the target for more even coverage of the target material. The mastering pattern and other setup parameters are remotely altered and recorded in computer n.2.

A high energy pulsed eximer laser required for pulsed laser deposition of materials is shown as component h. This laser is capable of generating pulses of coherent ultraviolet laser light at energy densities exceeding 2 Joules/cm$^2$ at pulse rates greater than 90 Hertz. The laser is directed toward the mechanical mirror g. which in turn directs the laser energy to the target material in the raster pattern input to the computer. Lasing gas condition, cavity voltages, energy density per pulse, and other setup parameters are remotely altered and recorded in computer n.2.

A substrate bias voltage direct current regulated power supply is shown at component i. A bias is given to the substrate material to speed up the rate at which the plasma is deposited on the substrate. A bias on the substrate makes the substrate more attractive to the plasma and consequently it is deposited at a quicker rate. The speed of deposition is significant in that the deposition rate determines the chemical and mechanical properties of the film deposited. Substrate current voltage, and other setup parameters are remotely altered and recorded in computer n.2.

The components shown at j.1 and j.2, a proportional integral derivative (PID) feed back controller and a silicon controlled rectifier (SCR) high current power driver for tungsten heating element, respectively, stabilize the substrate thermal temperature during deposition by providing a phase angled current thereto. Components j.1 and j.2 operate by thermally heating the substrate which in turn controls the chemistry and microstructure of the film deposited by improving the crystal structure of the film on the substrate.

Components k.1 through k.11 provide automatic remote control and maintenance of deposition background vacuum. Deposition background vacuum is achieved in two stages. First, a rough chamber evacuation is accomplished followed by a sensitive chamber evacuation. Component k.1 is an ion gage used to read and verify sufficient ultrahigh vacuum, or sensitive chamber evacuation, required for pulsed laser deposition of diamond-like carbon films. The ion gage at k.1 is read and powered by the multiple gage controller shown at k.3. The capacitive manometer gage shown at k.2 is also read and powered by the multiple gage controller k.3 as is the thermocouple gage of k.9. The thermocouple gage k.9 is necessary to read and verify sufficient foreline vacuum required for operation of turbomolecular pump shown at k.8. and for opening of the foreline solenoid valves shown at k.5 and k.6. The foreline solenoid valve k.5 connects the foreline vacuum to the turbomolecular pump inlet and the foreline solenoid valve k.6. connects the foreline vacuum to the chamber rougher vacuum inlet and allows for chamber roughdown to turbomolecular operation vacuum. The shop air supply shown at m. is maintained at 80 pounds per square feet and is needed to operate the foreline valves. The turbomolecular drag pump, shown at k.8, makes operation under high gas loads possible, while developing an ultrahigh vacuum necessary for pulsed laser deposition of diamond-like carbon films.

A manual up to air valve is shown at k.4. which is necessary so that the chamber can be equilibrated to atmosphere in case of a power outage or computer control failure. The turbomolecular pump inlet valve represented at k.7 connects the foreline vacuum to the turbomolecular pump inlet. This valve k.7 allows turbomolecular pump to achieve ultrahigh vacuum pump down necessary to pulsed laser deposition of diamond-like carbon. A diaphragm or oil vane foreline pump DUO065 is shown at k.10 which provides an initial pump down of the chamber during rough evacuation and a turbomolecular pump controller is shown at k.11 which is necessary for operation of the turbomolecular drag pump k.8.

Components l.1 through l.4 provide automatic remote control and maintenance of deposition inert gasses acetylene, nitrogen and argon. The mass flow system shown at l.1 is capable of regulating mass flows in single or ratio fashion. A mass flow driver and sensor combination shown at l.2 regulates gas flow for acetylene gas and operates by receiving an analog input control signal from the mass flow system of l.1. A mass flow driver and sensor combination for regulating mass flow for nitrogen gas is shown at l.3 and also operates by receiving analog input control signals from the mass flow system l.1. Finally, a mass flow driver and sensor combination for regulating mass flow for argon gas is shown at l.4 and again operates by receiving analog input control signals from the mass flow system l.1.

A pressurized air supply for actuation of pneumatic valves is represented at m. which regulates pressure to a valve sufficiently high to actuate all pneumatic valves of the process.

Components n.1 and n.2 comprise a computer control system capable of digital and analog input and output control voltages for automation of the entire deposition process. Hardware and software contained therein capable of interfacing with components a. through n. executes process control. Recipe control to generate specific films is also automated by the computer control system.

FIGS. 4–12 herein are flow charts of recipes used in the computer control system. The process control hardware interface module is represented at n.1. and switches voltages via contact closures, digital signals, and reading digital signals and switch closures. The module n.1. receives and sends information and is connected to a process central processing unit computer represented at n.2 capable of executing code described in the recipes. The computer n.2. is connected to instrument components a through l as well as to n.1 to integrate the entire multilayer deposition process.

Tables 1a and 1b set forth parameters used in a multiple layer film recipe. The Table 1a and 1b parameters are used in a recipe which is a modified recipe algorithm that loops on a single layer recipe several times. The looping, or repeatability, is made possible by the invention. The invention allows the deposition of repetitive layers of the same composition, often up to 20 layers of the same composition. Manual control would result in inconsistency in the 20 layers which would minimize the benefits of a multilayer interlayer. The repeatability made possible by the invention improves film characteristics by a repeatable deposition of several Ti/diamond-like carbon (DLC) layer pairs, eg. 20, on top of the graded layer. The repeatable deposition of Ti—DLC layers improves toughness of the upper layers and increases total thickness of the wear resistant film. Specifically, this resulted in an increase of the film life by a factor of three.

Table 2 shows a table setting forth parameters used in a recipe for a graded Ti—TiC—DLC layer generated by the computer controlled multilayer deposition apparatus of the invention. The parameters set forth in Table 2 produce a load supporting Ti/TiC/Ti—DLC interlayer with the hardness varied gradually from steel to DLC and improved adhesion which eliminates failure by cracking and delamination at pressures of about 1 GPa and above. In contrast, a direct deposition of DLC films using known methods protects the substrate from ball-on-disk sliding wear only at contact pressures of about 1 GPa and below; at higher contact pressures the substrate deformation causes film bending and consequent failure by cracking and delamination.

Figure 3A:
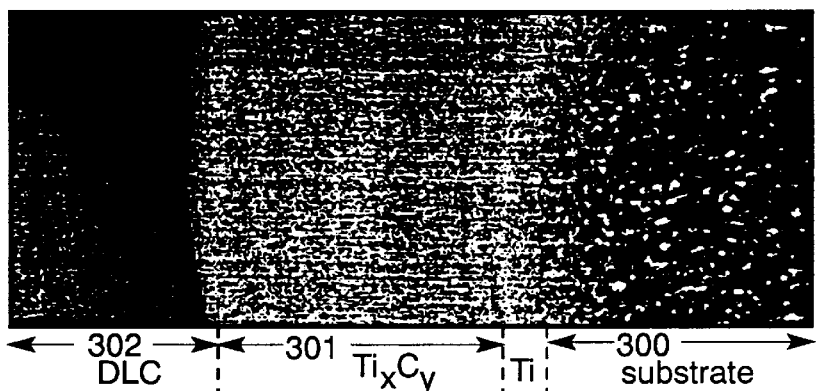
FIG. 3a is a photograph of a cross section of a Ti—TiC—DLC coating produced by an x-ray photoelectron spectroscopy.
Figure 3B:
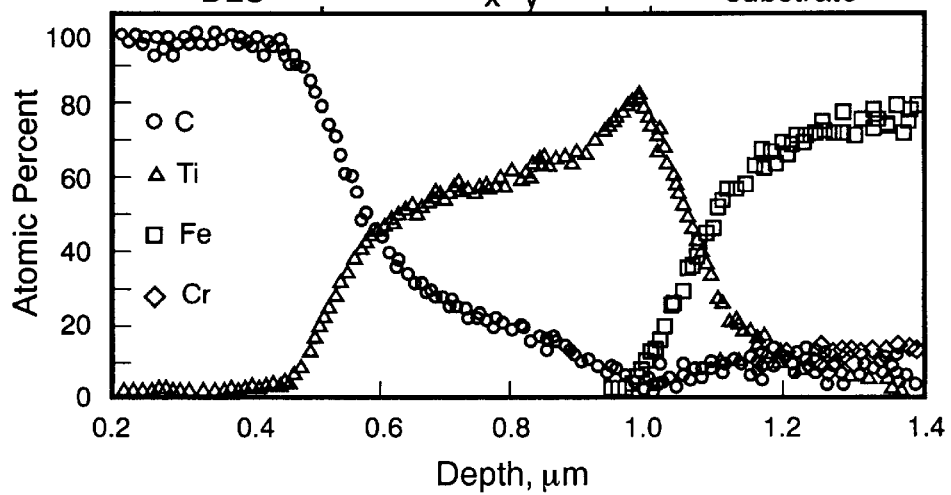
FIG. 3b is a depth profiling compositional plot of a Ti—TiC—DLC coating.
Figure 4:
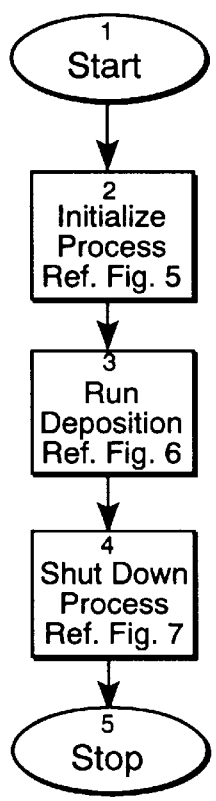
FIG. 4 is a master multilayer recipe flowchart.

FIG. 3b shows the compositional variation of the resulted Ti/TiC/DLC coating aligned on the thickness scale on the x-axis with a photograph 3a. of a cross section produced by an Ar etch in an x-ray photoelectron spectroscopy (XPS) depth profiling. Initially, a 50 nm Ti layer was deposited onto 440C steel substrate shown at 300 on the graph of FIG. a. Then, the carbon content was gradually increased to form a 0.4 nm thick $Ti_xC_y$ layer shown at 301 in FIG. 3a. This provided a gradual transition from Ti to TiC and the increase of the interlayer hardness from 4 GPa to around 30 GPa before the transition into a DLC layer shown at 302 in FIG. 3a with a hardness of 40–50 GPa. After the growth of a 0.1 μm thick DLC layer, the hardness of the final layer was increased to 60–70 GPa by reducing Ar back pressure in the chamber. The total thickness of the DLC layer was about 0.5 μm. Gradient transitions of structural and mechanical properties across the coating thickness without sharp interfaces considerably improves the coating response to high contact load.

Figure 5:
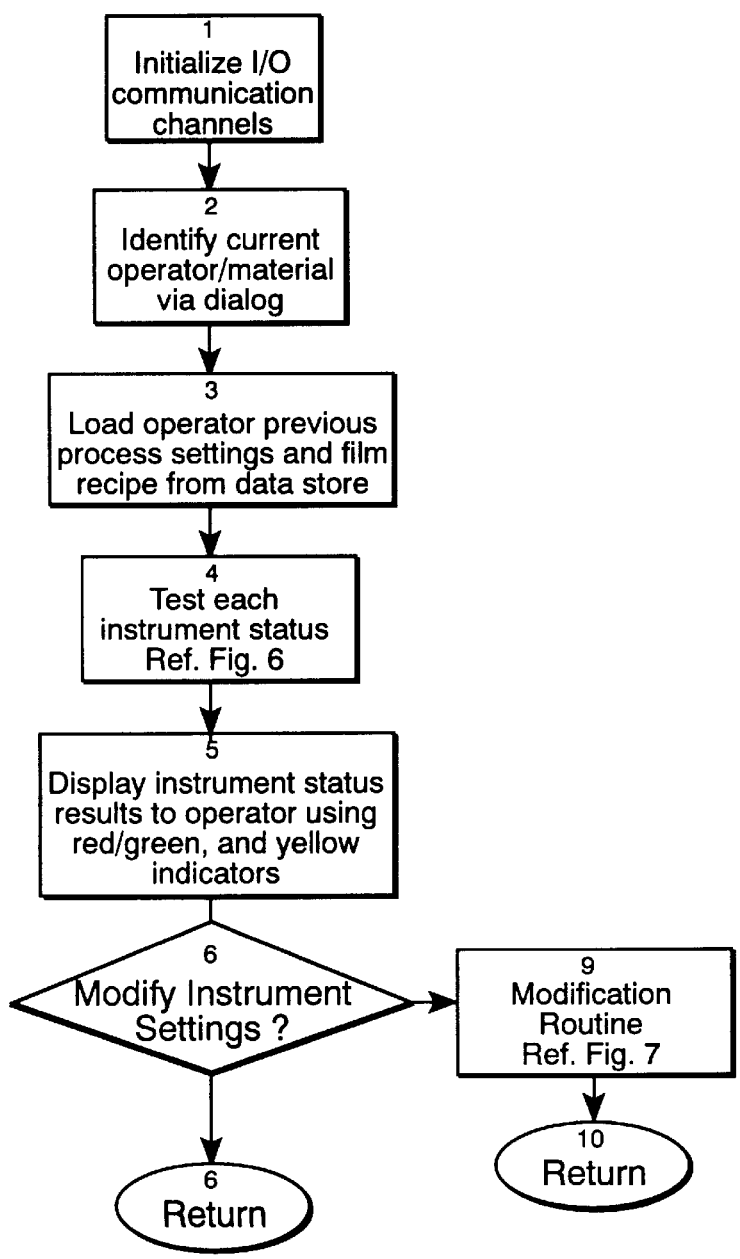
FIG. 5 is a multilayer recipe control flow chart.
Figure 6:
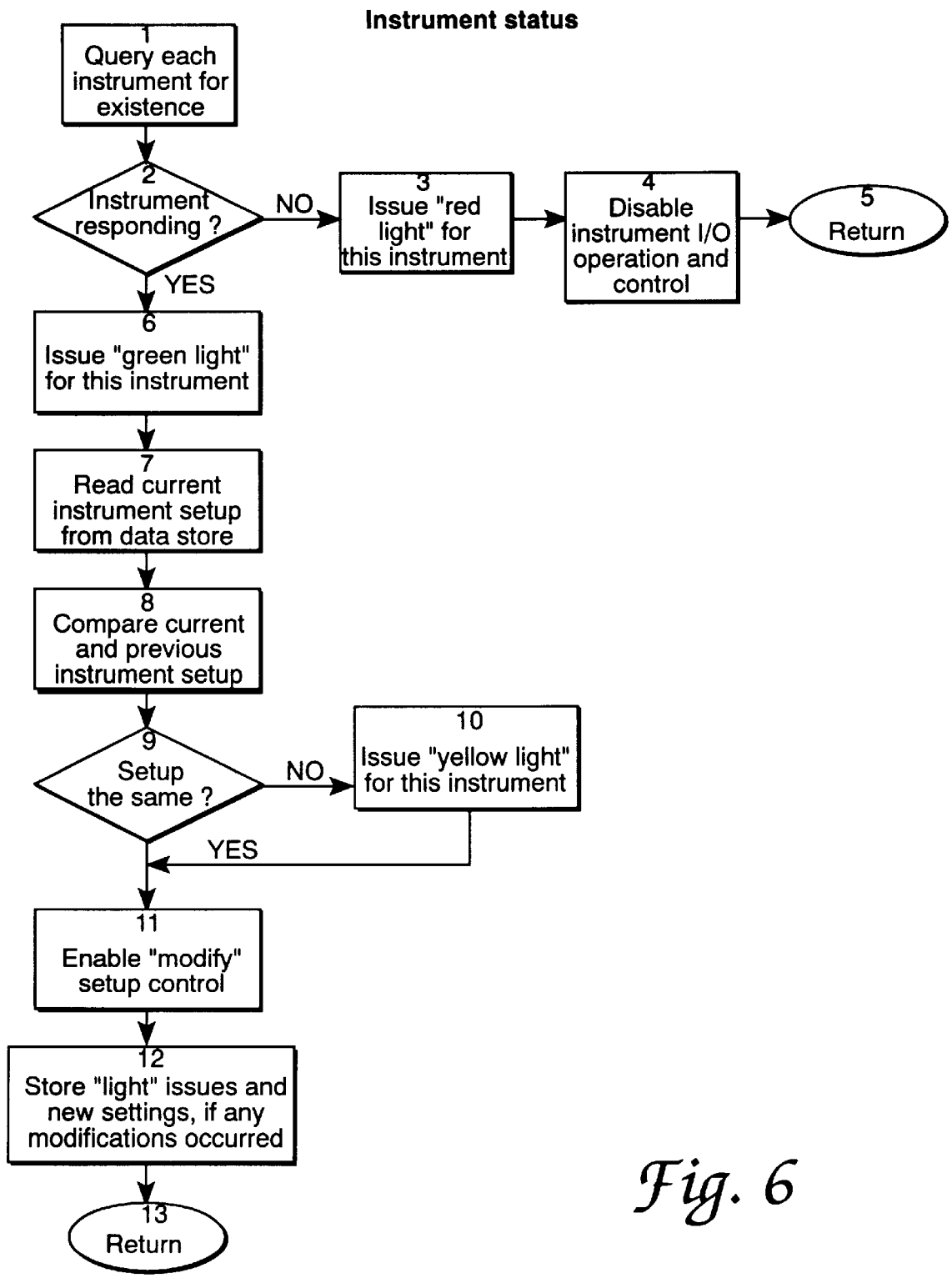
FIG. 6 is a process initialization recipe flow chart.
Figure 7:
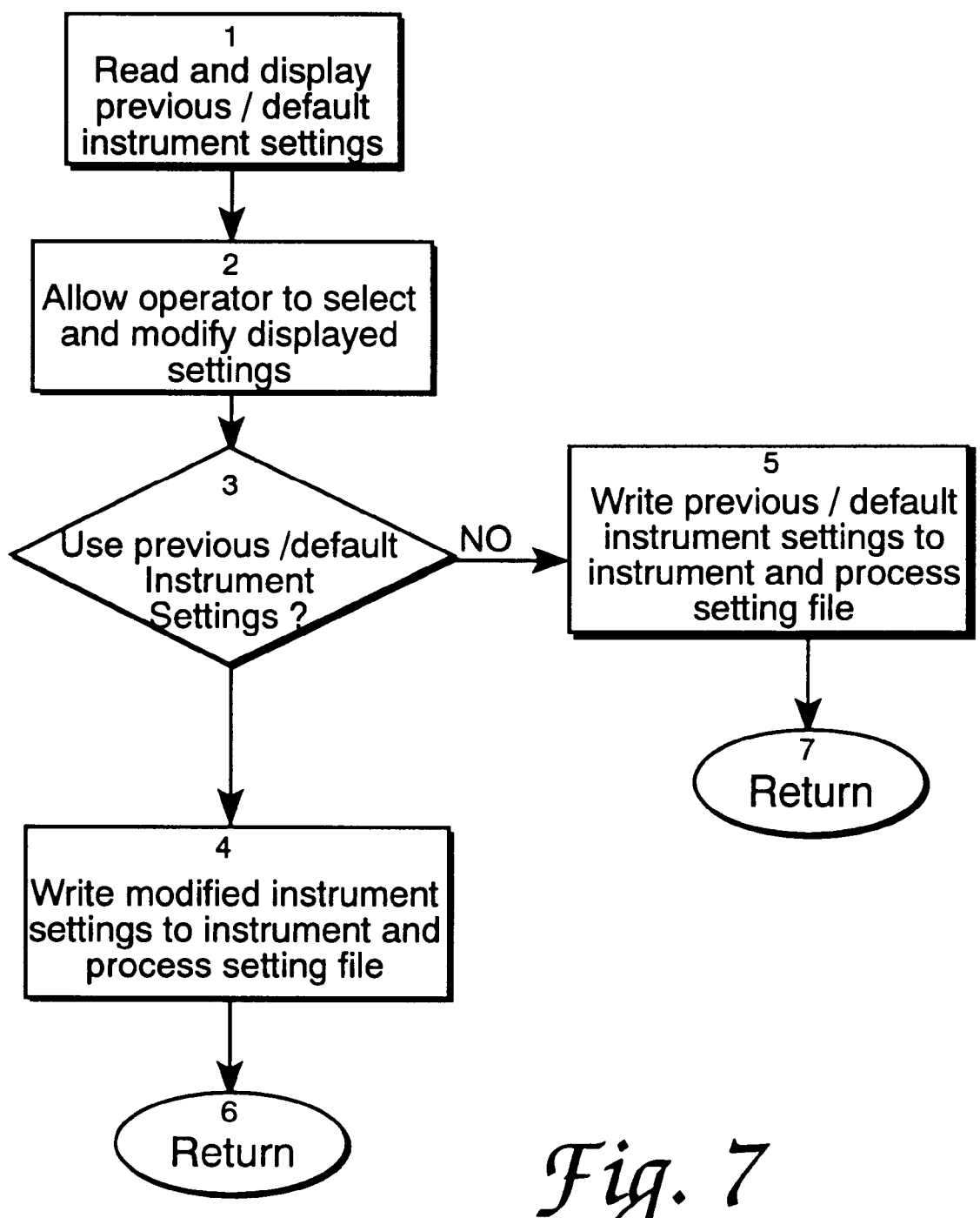
FIG. 7 is an instrument status recipe flow chart.
Figure 8:
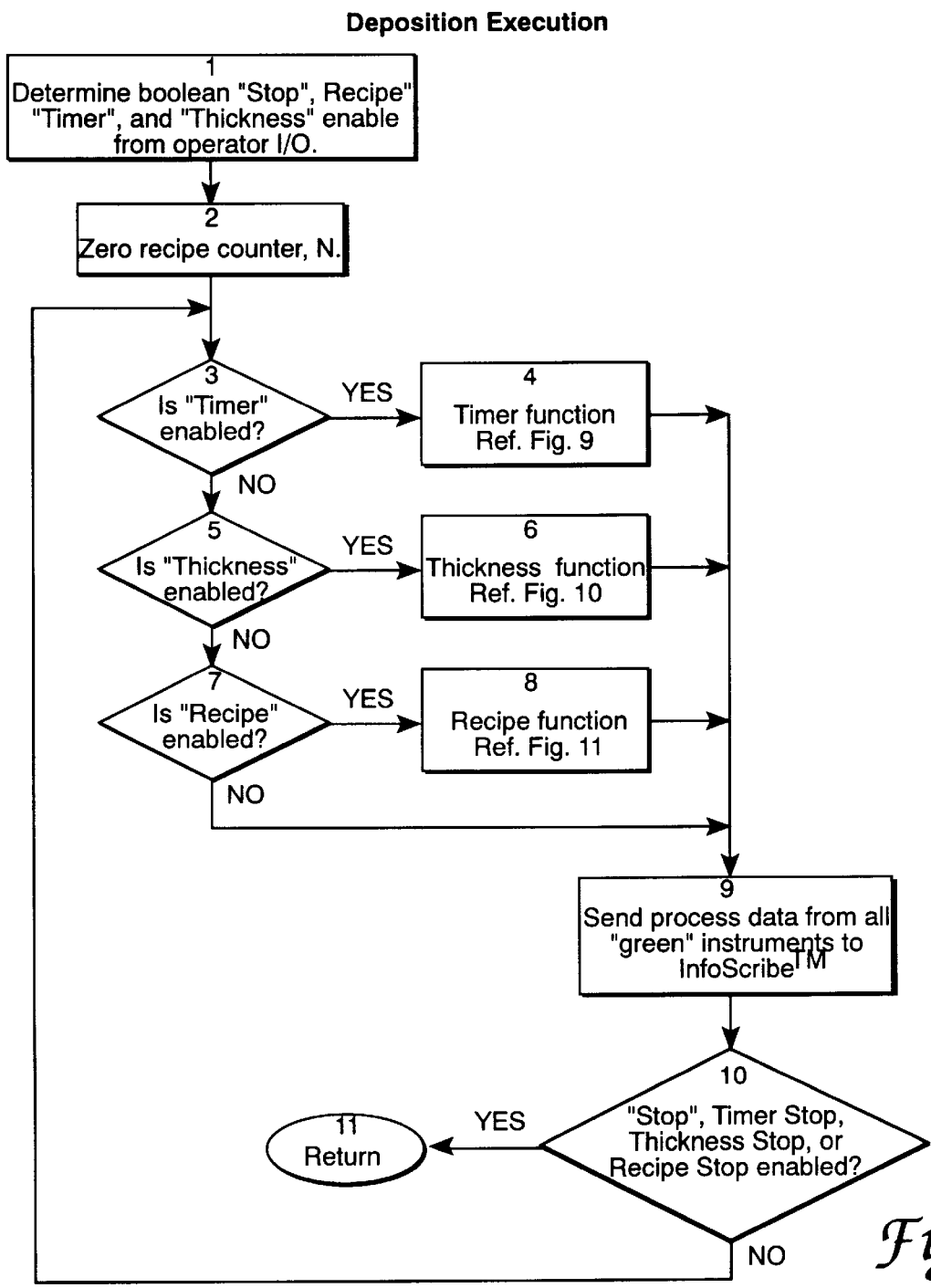
FIG. 8 is a deposition execution recipe flow chart.
Figure 9:
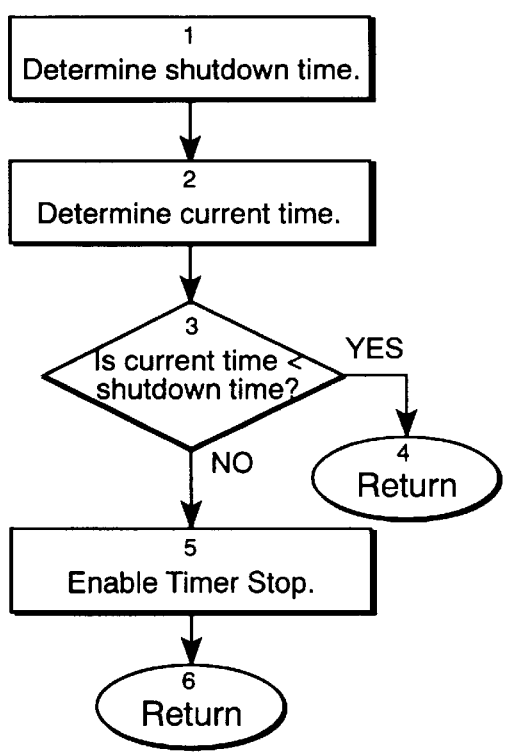
FIG. 9 is a timer function recipe flow chart.
Figure 10:
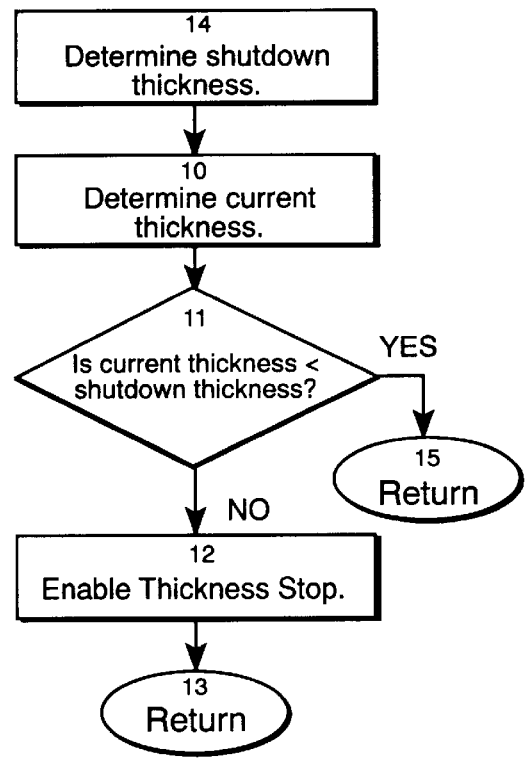
FIG. 10 is a thickness function recipe flow chart.
Figure 11:
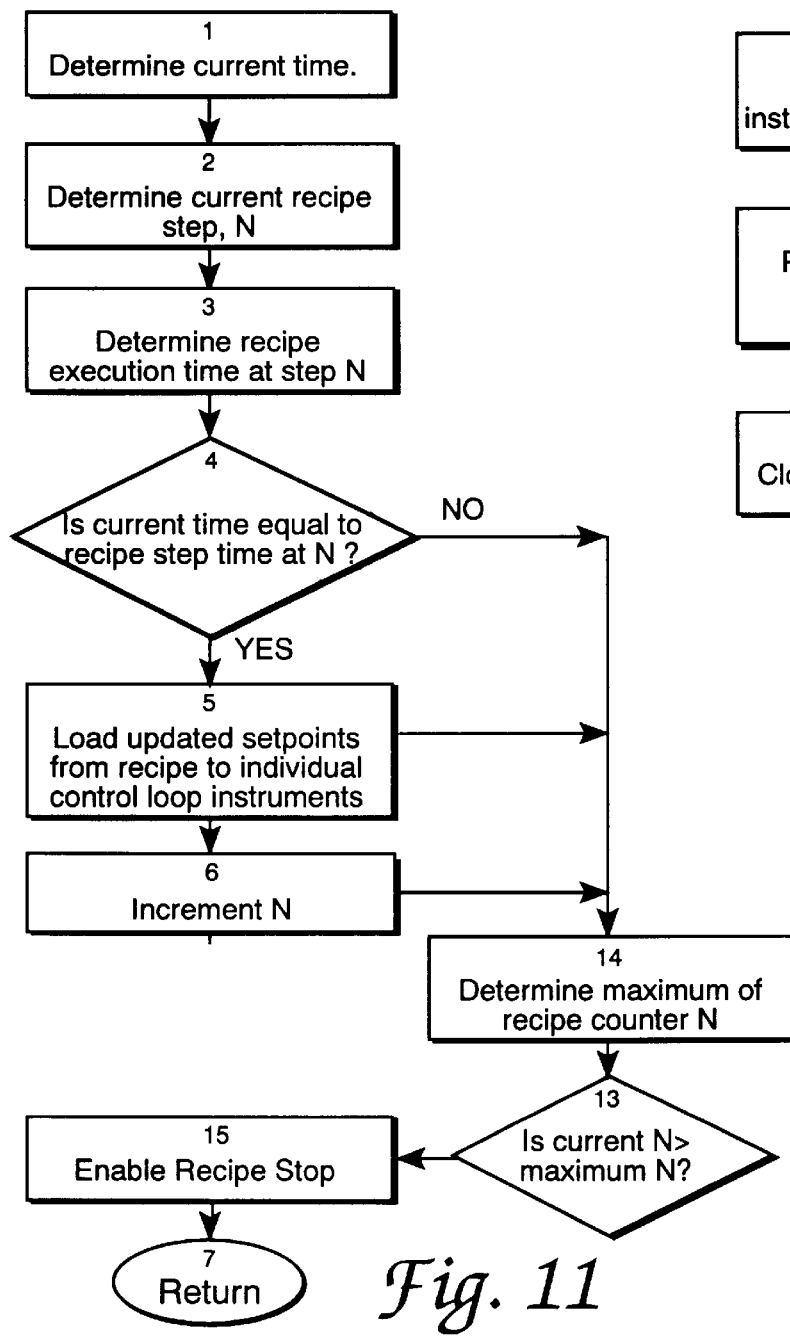
FIG. 11 is a substrate cleaning recipe flow chart.
Figure 12:
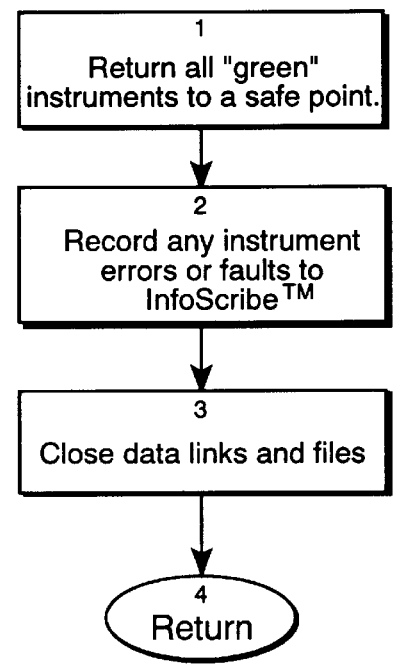
FIG. 12 is a deposit interlayer recipe flow chart.
Figure 13:
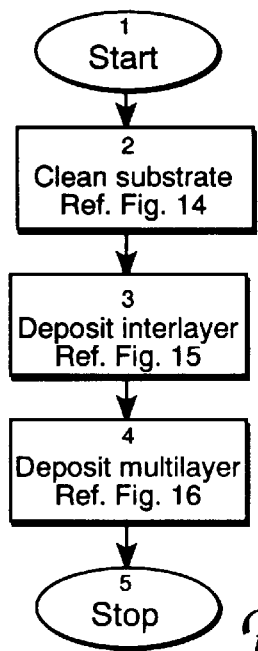
FIG. 13 is a deposit multilayer recipe flow chart.
Figure 14:
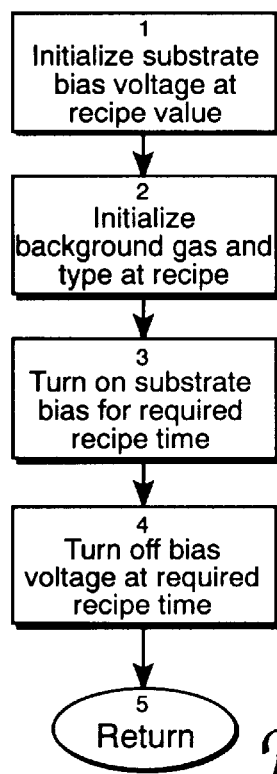
FIG. 14 is a recipe function flow chart.
Figure 15:
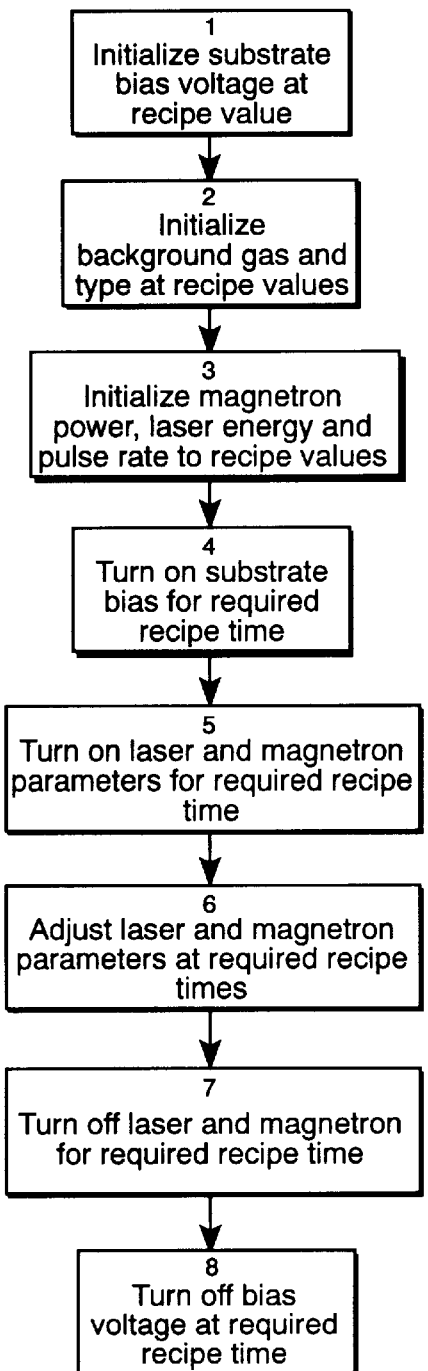
FIG. 15 is shut down process recipe flow chart.
Figure 16:
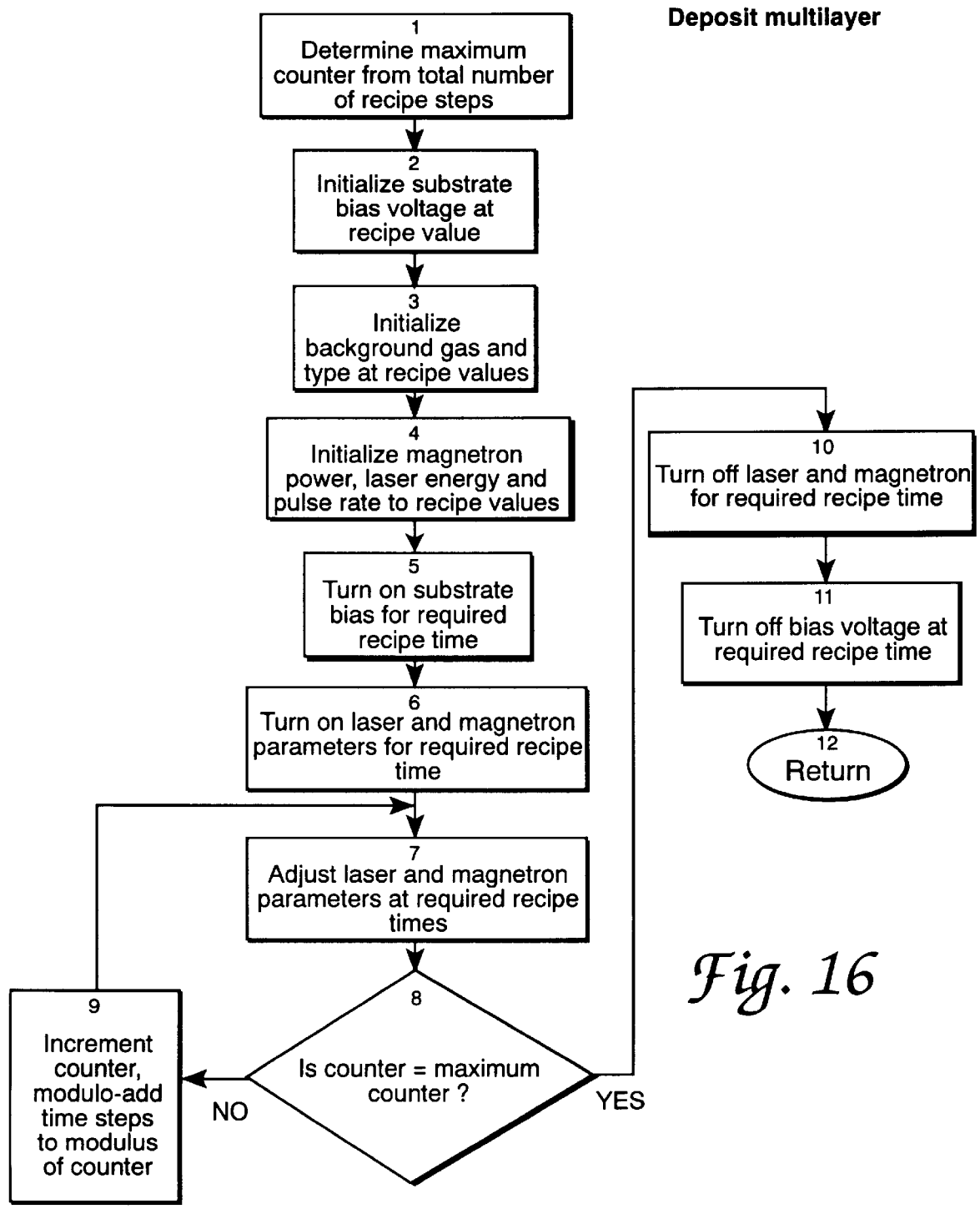
FIG. 16 is a multilayer deposition flowchart.

FIGS. 4 through 16 are flow charts representing computer control algorithms and "recipes" used to operate the automated apparatus of FIG. 2. The flow charts of FIG. 4–12 are master control process algorithms that call in subroutines that control the processes of cleaning the substrate, depositing interlayers and then depositing multilayers. Process initialization and instrument status is controlled as shown in FIGS. 5 and 6, respectively. Deposition is controlled as shown in FIGS. 7–11 and shutdown is controlled as shown in FIG. 12. The recipes for deposition execution are found in FIGS. 13–16. The flow chart of the recipe controlling the cleaning and preparation of the substrate is shown in FIG. 14 and the flow chart of the recipe for controlling deposition of an interlayer is shown in FIG. 15. A flow chart of a computer recipe or algorithm for controlling deposition of a multilayer film is shown in FIG. 16.

The combined processes of pulsed laser deposition and magnetron sputtering are attractive for use in the tool making industry and other industries where thin, hard coatings are desired. The combined processes are able to produce graded thin films on tools or manufacturing parts which are harder, more resilient and last longer than films produced with conventional methods. The capability of producing numerous films of consistent composition introduces the option of depositing an interlayer between the substrate and the desired graded thin film. The interlayer consists of many thin layers of the same composition and serves as a base layer for better adherence of the graded, thin film and minimizes ambiguities from operator-to-operator in substrate preparation. Repetitively and systematically producing films of the same composition and structure using the combined deposition techniques is nearly impossible without automated control of the deposition such as disclosed in the invention. In addition to the high probability of human error in setting up and monitoring the multifaceted deposition process, manual control of film deposition lacks the capability of integrating film deposition parameters whereby a decrease in one parameter can be balanced by an increase in a second parameter—a capability provided for in the invention. Furthermore, manual control of film deposition does not provide for a record of all parameters and deviations during film deposition which can be critical in determining whether a given deposition is suitable for the intended purpose—a capability provided for in the invention. The invention allows for high volume production of films with consistent composition and structure thereby allowing the combined deposition technique to be commercially exploited.

It is understood that certain modifications to the invention as described may be made, as might occur to one with skill in the field of the invention, within the scope of the appended claims. All embodiments contemplated hereunder which accomplish the objects of the invention have therefore not been shown in complete detail. Other embodiments may be developed without departing from the spirit of the invention or from the scope of the appended claims.

TABLE 1a

- Interlayer recipe, repeat once. -

| HOUR | MIN. | SEC. | E(mJ) | P(Hz) | PR(mT) | B(V) | M(W) | G(U) | Result |
|---|---|---|---|---|---|---|---|---|---|
| 0 | 2 | 0 | 0 | 0 | 100 | −600 | 0 | Ar | Etch (440C) |
| 0 | 30 | 0 | 0 | 0 | 0 | 0 | 0 | 0 | |
| 0 | 35 | 0 | 0 | 0 | 2 | 0 | 100 | Ar | Ti 100 |
| 0 | 40 | 0 | 200 | 1 | 2 | −60 | 100 | Ar | Ti 90/C 10 |
| 0 | 41 | 0 | 200 | 2 | 2 | −60 | 100 | Ar | |
| 0 | 42 | 0 | 200 | 3 | 2 | −60 | 100 | Ar | |
| 0 | 45 | 0 | 200 | 4 | 2 | −60 | 100 | Ar | |
| 1 | 10 | 0 | 200 | 6 | 2 | −60 | 100 | Ar | |
| 1 | 19 | 0 | 200 | 12 | 2 | −60 | 100 | Ar | Ti 25/C 75 |
| 1 | 20 | 0 | 200 | 20 | 0 | −60 | 0 | Ar | C 100 soft |
| 1 | 25 | 0 | 0 | 0 | 2 | 0 | 100 | Ar | |
| 1 | 26 | 0 | 0 | 0 | 0 | 0 | 0 | 0 | |

TABLE 1b

- Multilayer recipe section, repeat 20 times for 20 layers. -

| HOUR | MIN. | SEC. | E(mJ) | P(Hz) | PR(mT) | B(V) | M(W) | G(U) | Result |
|---|---|---|---|---|---|---|---|---|---|
| 0 | 0 | 30 | 200 | 20 | 0 | 0 | 0 | 0 | C 100 DLC |
| 0 | 4 | 0 | 0 | 0 | 20 | 0 | 0 | Ar | |
| 0 | 4 | 15 | 200 | 10 | 2 | −60 | 100 | Ar | Ti 30/C 70 |
| 0 | 4 | 30 | 200 | 3 | 2 | −60 | 100 | Ar | Ti 50/C 50 |
| 0 | 4 | 45 | 200 | 1 | 2 | −60 | 100 | Ar | Ti 90/C 10 |
| 0 | 5 | 0 | 0 | 0 | 2 | −60 | 100 | Ar | Ti 100 |
| 0 | 5 | 15 | 200 | 1 | 2 | −60 | 100 | Ar | Ti 90/C 10 |
| 0 | 5 | 30 | 200 | 3 | 2 | −60 | 100 | Ar | Ti 50/C 50 |
| 0 | 5 | 45 | 200 | 10 | 2 | −60 | 100 | Ar | Ti 30/C 70 |
| 0 | 6 | 0 | 0 | 0 | 0 | 0 | 0 | 0 | |

TABLE 2

| HOUR | MIN. | SEC. | E(mJ) | P(Hz) | PR(mT) | B(V) | M(W) | G(U) | Result |
|---|---|---|---|---|---|---|---|---|---|
| 0 | 15 | 0 | 0 | 0 | 100 | −600 | 0 | Ar | Substrate Etch (Si) |
| 0 | 30 | 0 | 0 | 0 | 0 | 0 | 0 | 0 | Etch Complete |
| 0 | 34 | 0 | 0 | 0 | 20 | 0 | 0 | Ar | Start Deposition |
| 0 | 35 | 0 | 0 | 0 | 2 | −60 | 50 | Ar | 50 nm Ti Interlayer |
| 0 | 40 | 0 | 200 | 1 | 2 | −60 | 50 | Ar | 50 nm Ti 90/C 10 |

TABLE 2-continued

| HOUR | MIN. | SEC. | E(mJ) | P(Hz) | PR(mT) | B(V) | M(W) | G(U) | Result |
|---|---|---|---|---|---|---|---|---|---|
| 0 | 45 | 0 | 200 | 1 | 2 | −60 | 100 | Ar | |
| 0 | 46 | 0 | 200 | 2 | 2 | −60 | 100 | Ar | 100 nm Ti 70/C 30 |
| 0 | 55 | 0 | 200 | 3 | 2 | −60 | 100 | Ar | |
| 0 | 56 | 0 | 200 | 4 | 2 | −60 | 100 | Ar | 100 nm Ti 50/C 50 |
| 1 | 5 | 0 | 200 | 5 | 2 | −60 | 100 | Ar | |
| 1 | 5 | 30 | 200 | 6 | 2 | −60 | 100 | Ar | |
| 1 | 6 | 0 | 200 | 7 | 2 | −60 | 100 | Ar | 100 nm Ti 30/C 70 |
| 1 | 15 | 0 | 200 | 8 | 2 | −60 | 100 | Ar | |
| 1 | 15 | 15 | 200 | 9 | 2 | −60 | 100 | Ar | |
| 1 | 15 | 30 | 200 | 10 | 2 | −60 | 100 | Ar | |
| 1 | 15 | 45 | 200 | 11 | 2 | −60 | 100 | Ar | 25 nm Ti 25/C 75 |
| 1 | 17 | 30 | 200 | 15 | 2 | −60 | 100 | Ar | |
| 1 | 17 | 45 | 200 | 20 | 2 | −60 | 100 | Ar | 25 nm Ti 10/C 90 |
| 1 | 18 | 0 | 200 | 25 | 2 | −60 | 100 | Ar | |
| 1 | 18 | 15 | 200 | 30 | 2 | −60 | 100 | Ar | |
| 1 | 18 | 30 | 200 | 35 | 2 | −60 | 100 | Ar | |
| 1 | 20 | 0 | 200 | 35 | 2 | 0 | 0 | Ar | |
| 1 | 20 | 5 | 200 | 20 | 2 | 0 | 0 | Ar | 100 nm soft DLC |
| 1 | 25 | 0 | 200 | 20 | 0 | 0 | 0 | 0 | 400 nm hard DLC |
| 1 | 45 | 0 | 0 | 0 | 0 | 0 | 0 | 0 | END |

We claim:

1. A computer control system for generating graded magnetron sputtering and pulsed laser plasma deposition multilayer films on a substrate disposed within a vacuum chamber, comprising:

a digital computer having data communication ports including a digital computer input port and a digital computer output port;

an ultrahigh vacuum chamber pressure control system comprising, a vacuum chamber pressure control algorithm received in said digital computer, vacuum chamber pressure measuring coarse and sensitive pressure to electrical signal transducers connected with said vacuum chamber and also with said digital computer input port and said pressure control algorithm, and vacuum chamber coarse and sensitive pressure control valves connected between a source of vacuum and said vacuum chamber and responsive to computer output port pressure control algorithm output signals and algorithm input signals received from said pressure measuring coarse and sensitive pressure to electrical signal transducers;

a plurality of computer controlled vacuum chamber inert gas mass flow regulating components capable of delivering inert gas into said chamber at a preselected mass flow rate including an inert gas supply coupled to said digital computer output port;

an inert gas chamber pressure control system comprising, an inert gas chamber pressure and composition control algorithm received in said digital computer, a magnetron spectral emission sensor communicating with said vacuum chamber and said pressure and composition control algorithm, a mass spectrometer communicating with said vacuum chamber and said pressure and composition control algorithm, a pressure gage communicating with said vacuum chamber and said pressure and composition control algorithm and a pressure controller communicating with said vacuum chamber and said pressure and composition control algorithm, and chamber pressure control valves communicating with said pressure controller;

a plurality of computer controlled magnetron current and voltage monitoring and regulating components communicating with said digital computer input port and a magnetron sputtering control algorithm received in said digital computer;

a plurality of computer controlled laser plasma energy monitoring components communicating with said digital computer input port and a laser plume control algorithm received in said digital computer;

a multilayer film deposition rate monitoring component communicating with said digital computer input port and a deposition rate algorithm received in said digital computer; and substrate bias and temperature regulating components communicating with said digital computer input port and a substrate bias and temperature control algorithm received in said digital computer, negative bias and substrate temperature regulation operating to cause film deposition at a faster rate.

2. The computer control system for generating graded magnetron sputtering and pulsed laser plasma deposition multilayer films on a substrate disposed within a vacuum chamber of claim 1, said inert gas supply being a gas or mixture selected from the group consisting of argon, krypton and xenon.

3. The computer control system for generating graded magnetron sputtering and pulsed laser plasma deposition multilayer films on a substrate disposed within a vacuum chamber of claim 1, said laser plasma energy monitoring component comprising an optical emission spectroscope measuring the energy of the fluoresced plasma as a function of time, wherein quality of the multilayer film deposited is dependent thereon.

4. The computer control system for generating graded magnetron sputtering and pulsed laser plasma deposition multilayer films on a substrate disposed within a vacuum chamber of claim 1, said multilayer film deposition rate monitoring component comprising a quartz crystal microbalance sensor within said chamber communicating with said digital computer input port and a film deposition rate control algorithm received in said computer, said quartz crystal microbalance sensor receiving film deposition coincident with said substrate and generating a frequency proportional thereto.

5. The computer control system for generating graded magnetron sputtering and pulsed laser plasma deposition multilayer films on a substrate disposed within a chamber of claim 1, said pressure controller being a proportional integral derivative feedback controller.

6. The computer control system for generating graded magnetron sputtering and pulsed laser plasma deposition multilayer films on a substrate disposed within a vacuum chamber of claim 5 wherein said plurality of computer controlled vacuum chamber inert gas mass flow regulating components further comprise:
   an optical emission spectrometer detecting spectral emission of a target material for sputtering;
   a proportional integral derivative feedback controller communicating with said digital computer input port and a chamber pressure control algorithm received in said digital computer, said proportional integral derivative feedback controller connected to said optical emission spectrometer and receiving an analog signal therefrom proportional to pressure of inert gas in said chamber;
   a piezoelectric valve driver connected to said proportional integral derivative feedback controller and receiving an analog output therefrom proportional to required change in said chamber pressure, a required change in said chamber pressure determined by a preselected value from said chamber pressure control algorithm relative to chamber pressure; and
   a pressure releasing piezoelectric valve connected to said piezoelectric valve driver opening to release pressure of inert gas in said chamber and thereby reducing magnetron source spectral emission.

7. The computer control system for generating graded magnetron sputtering and pulsed laser plasma deposition multilayer films on a substrate disposed within a chamber of claim 1, said laser plasma energy monitoring components comprising an optical emission spectroscope.

8. The computer control system for generating graded magnetron sputtering and pulsed laser plasma deposition multilayer films on a substrate disposed within a chamber of claim 1, said substrate bias regulating components comprising a voltage direct current regulated power supply.

9. The computer control system for generating graded magnetron sputtering and pulsed laser plasma deposition multilayer films on a substrate disposed within a chamber of claim 1, said substrate temperature regulating components comprising a silicon controlled rectifier high current driver heating element.

10. The computer control system for generating graded magnetron sputtering and pulsed laser plasma deposition multilayer films on a substrate disposed within a chamber of claim 1, said coarse pressure to electrical signal transducer comprising an ion gage.

11. The computer control system for generating graded magnetron sputtering and pulsed laser plasma deposition multilayer films on a substrate disposed within a chamber of claim 1, said sensitive pressure to electrical signal transducer comprising a thermocouple gage.

12. The computer control system for generating graded magnetron sputtering and pulsed laser plasma deposition multilayer films on a substrate disposed within a chamber of claim 1, said chamber coarse pressure control valve comprising a diaphragm foreline pump.

13. The computer control system for generating graded magnetron sputtering and pulsed laser plasma deposition multilayer films on a substrate disposed within a vacuum chamber of claim 1, said multilayer film comprised of Ti—DLC of 10–100 angstroms per layer.

14. The computerized method of forming a metallurgical material inclusive of a graded multiple layered hardened coating film, said method comprising the steps of:
   disposing a metallic substrate member within a closeable evacuatable sputtering pressure vessel having both magnetron and laser based sputtering energy sources and plural hardened coating material source targets included therein;
   evacuating said sputtering pressure vessel to a sputtering-enabling background vacuum level using a two step two pump evacuation sequence;
   monitoring and controlling said sputtering pressure vessel background evacuating step from a repetitive algorithm running in a process controlling computer;
   establishing selected additional sputtering-enabling environment conditions within said pressure vessel, said selected additional conditions including,
   vessel atmosphere gas content,
   metallic substrate member temperature,
   metallic substrate member positioning with respect to said sputtering sources and said hardened coating material source targets,
   sputtered material thickness and deposition rate on said metallic substrate member, and
   magnetron sputtering plasma emission spectroscopy;
   selecting and controlling each of said selected additional sputtering environment conditions from additional repetitive algorithms running in said process controlling computer;
   forming graded multiple layers of said hardened coating material film over said metallic substrate by simultaneously operating said magnetron and laser sputtering sources to ablate hardened coating-comprising materials from said plurality of hard material target sources during a metallurgical material-coating sputtering operation; and
   controlling said forming step and said graded multiple layered hardened coating layers film through varying relative outputs of each said magnetron and laser sputtering sources from another algorithm running in said process controlling computer.

15. The computerized method of forming a metallurgical material of claim 14 wherein said step of forming graded multiple layers includes:
   operating a pulsed ultraviolet eximer laser at pulse rates greater than ninety Hertz; and
   rastering a beam from said laser onto a laser-related one of said source targets.

16. The computerized method of forming a metallurgical material of claim 14 wherein said step of controlling said forming step and said graded multiple layered hardened coating layers also includes determining a quantity of target material atoms ionized by changing a magnetron power level.

17. The computerized method of forming a metallurgical material of claim 16 wherein said method further includes the steps of:
   regulating plasma emission spectroscopy in said magnetron based sputtering energy source by altering instantaneous pressure of an inert gas in said pressure vessel with a rate of vessel pressure change responding algorithm in said process controlling computer;
   monitoring inert gas constituents in said pressure vessel using a quadrapole mass spectrometer coupled with said process controlling computer;
   measuring pulsed laser deposition plume species energy and energy of a fluoresced plasma, including number of atoms fluorescing as a function of time, using a sampling optical emission spectroscope coupled with said process controlling computer;

controlling sputtered material thickness and deposition rate using a vibrating microbalance sensor having frequency signal coupling with said process controlling computer; and controlling laser energy density per pulse from an algorithm running in said process controlling computer.

18. The computerized method of forming a metallurgical material of claim 17 wherein said method further includes controlling a rate of deposition onto said metallic substrate member and chemical and mechanical properties of said multiple layered hardened coating film by altering metallic substrate member bias voltage and current flow levels from an algorithm running in said process controlling computer.

19. The computerized method of forming a metallurgical material of claim 18 wherein said steps of evacuating said sputtering pressure vessel and monitoring and controlling said sputtering pressure vessel background evacuating step include evacuating said pressure vessel using a turbomolecular drag pump and coupling pressure responsive signals generated by an ion gauge, a capacitive manometer, and a thermocouple gauge into said process controlling computer.

* * * * *